US012610608B2

(12) United States Patent
Chen et al.

(10) Patent No.: US 12,610,608 B2
(45) Date of Patent: Apr. 21, 2026

(54) HYBRID FIN-DIELECTRIC SEMICONDUCTOR DEVICE

(71) Applicant: Taiwan Semiconductor Manufacturing Company, Ltd., Hsinchu (TW)

(72) Inventors: Yi-Huan Chen, Hsin Chu City (TW); Huan-Chih Yuan, Zhubei City (TW); Yu-Chang Jong, Hsinchu City (TW); Scott Yeh, Taoyuan City (TW); Fei-Yun Chen, Hsinchu (TW); Yi-Hao Chen, Taichung City (TW); Ting-Wei Chou, Taichung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 813 days.

(21) Appl. No.: 17/895,323

(22) Filed: Aug. 25, 2022

(65) Prior Publication Data
US 2024/0071833 A1 Feb. 29, 2024

(51) Int. Cl.
*H10D 84/03* (2025.01)
*H10D 30/01* (2025.01)
*H10D 84/01* (2025.01)
*H10D 84/85* (2025.01)

(52) U.S. Cl.
CPC ....... *H10D 84/038* (2025.01); *H10D 30/0243* (2025.01); *H10D 84/0193* (2025.01); *H10D 84/853* (2025.01)

(58) Field of Classification Search
CPC ......... H01L 21/823821; H01L 27/0924; H01L 29/6681; H01L 29/0653; H01L 29/1037; H01L 29/42368; H01L 29/66545; H01L 29/66575; H01L 29/66621; H01L 29/7834; H01L 21/823431
USPC .......................................................... 438/283
See application file for complete search history.

(56) References Cited

U.S. PATENT DOCUMENTS

| | | | | |
|---|---|---|---|---|
| 7,279,375 | B2 * | 10/2007 | Radosavljevic | .. H01L 29/66795 257/E29.296 |
| 7,352,030 | B2 * | 4/2008 | Furukawa | .............. B82Y 10/00 257/E21.546 |
| 7,915,641 | B2 * | 3/2011 | Otsuji | ............... H01L 31/02327 438/587 |
| 8,193,567 | B2 * | 6/2012 | Kavalieros | .......... H01L 29/1037 257/E29.264 |
| 10,418,464 | B2 * | 9/2019 | Glass | .............. H01L 21/823821 |
| 10,811,528 | B2 * | 10/2020 | Ebrish | ................. H01L 29/0653 |
| 11,069,587 | B2 * | 7/2021 | Campardo | .............. H01L 24/29 |
| 11,114,435 | B2 * | 9/2021 | Hellings | ............. H01L 29/0649 |
| 11,482,419 | B2 * | 10/2022 | Tsai | ................. H01L 29/66492 |
| 11,967,626 | B2 * | 4/2024 | Togo | ................... H01L 27/0886 |
| 2020/0135580 | A1 | 4/2020 | Hsieh et al. | |

(Continued)

*Primary Examiner* — Vu A Vu
(74) *Attorney, Agent, or Firm* — Eschweiler & Potashnik, LLC

(57) ABSTRACT

The present disclosure relates to a semiconductor device with a hybrid fin-dielectric region. The semiconductor device includes a substrate, a source region and a drain region laterally separated by a hybrid fin-dielectric (HFD) region. A gate electrode is disposed above the HFD region and the HFD region includes a plurality of fins covered by a dielectric and separated from the source region and the drain region by the dielectric.

20 Claims, 12 Drawing Sheets

(56) References Cited

U.S. PATENT DOCUMENTS

2021/0376113 A1    12/2021    Kao et al.
2022/0085187 A1     3/2022    Fan et al.

* cited by examiner

2000

| | |
|---|---|
| Form a STI structure within a substrate | —2002 |
| Form a LDS region and a LDD region within the substrate | —2004 |
| Form a mask over the substrate with openings over the LDS region, LDD region, and substrate | —2006 |
| Form fins from the substrate, LDS region, and LDD region according to the mask | —2008 |
| Form a dielectric between the fins where the fins and the dielectric form a HFD region | —2010 |
| Form a gate dielectric and a dummy gate over the HFD region | —2012 |
| Form a sidewall spacer along the dummy gate and over the gate dielectric | —2014 |
| Form a source region and a drain region between the HFD region and the STI structure | —2016 |
| Replace the dummy gate with a gate electrode and form a dielectric over the substrate | —2018 |
| Form source and drain pads within the LDS region and the LDD region | —2020 |
| Form a gate within the gate opening and a sidewall spacer on outer sidewalls of the gate | —2022 |

Fig. 20

HYBRID FIN-DIELECTRIC SEMICONDUCTOR DEVICE

BACKGROUND

Modern day integrated chips comprise millions or billions of semiconductor devices formed on a semiconductor substrate (e.g., silicon). Integrated chips (ICs) may use many different types of semiconductor devices, depending on an application of an IC. Fin structures may be formed for small scale devices with relative low operation voltages, while planar structures may be used for larger devices with relative high operation voltages. It may be desired to manufacture devices with various operation voltages onto one chip to achieve various circuit functions such as memory buffer, logic processing, source driver, gate driver, and so on.

BRIEF DESCRIPTION OF THE DRAWINGS

FIG. 20 illustrates a flow diagram of some embodiments of a method for forming a semiconductor device with a source, a drain, a gate electrode, and a HFD region including fins and a dielectric.

DETAILED DESCRIPTION

Figure 1A:
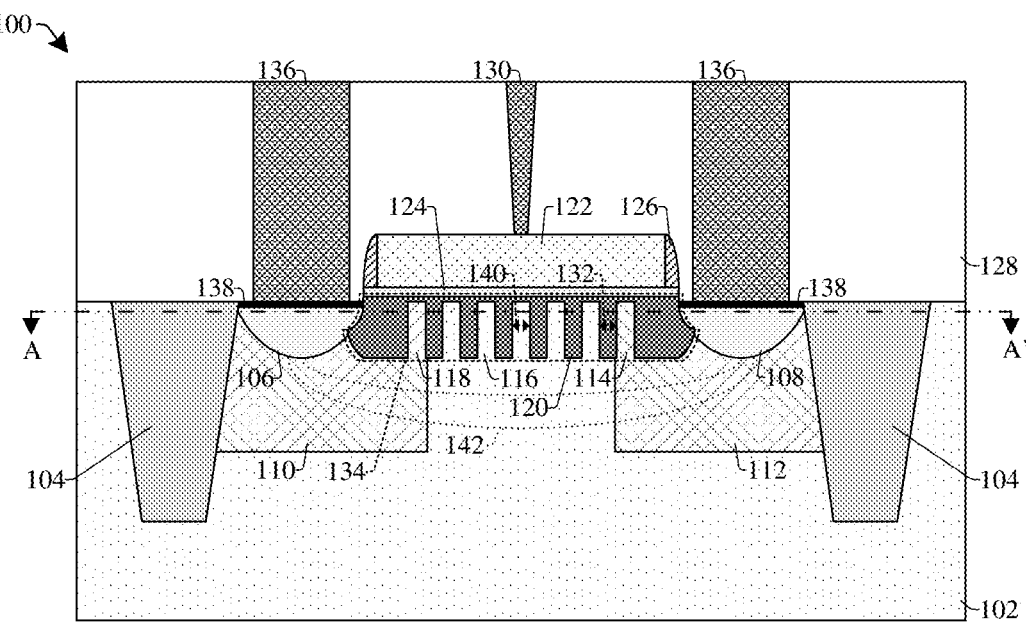
FIG. 1A illustrates a cross-sectional view of some embodiments of a transistor including a hybrid fin-dielectric (HFD) region below a gate electrode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Further, source/drain region(s) may refer to a source or a drain, individually or collectively dependent upon the context.

Loading effects cause variations in etching depth in semiconductor manufacturing when both sparse and dense mask patterns are included for an etching process of a wafer. For areas with larger aperture ratios, etchant radicals accumulate at unmasked area and generate by-product particles, which in turn slow down the etching rate. Thus, an area with a sparser mask pattern may experience a slower etching rate, and as a result, a smaller etching depth than another area of the wafer with a denser mask pattern. When devices of differing operation voltages are integrated on one chip, the prevalence of fin loading effects of three-dimensional transistors (e.g., fin field-effect transistors (FinFETs)) can increase, considering that the FinFETs may need much denser mask patterns than other planar devices because of its small dimensions.

For example, an all in one chip may comprise high-voltage (HV) (e.g., gate driver), (MV) medium-voltage (e.g., source driver), and low-voltage (LV) (e.g., memory or processing interfaces) devices. The HV and MV devices may be planar transistors, for example, metal-oxide-semiconductor field-effect transistor (MOSFET) devices including high-k metal gate (HKMG) devices, and the LV devices may be three-dimensional, for example, FinFETs. The HV and MV planar devices may have much greater dimensions (e.g., 10-100 times) than the LV FinFET devices. If HV and MV devices are manufactured separately from manufacturing the LV FinFET devices, additional processing steps are involved that complicates the process and increases the cost. On the other hand, if integrating the formation of recess regions in HV and MV devices together with the formation of fin structures for FinFETs, the etching loading effect may cause an unbalanced etching in the HV/MV region and the LV region. The LV region has significantly denser mask patterns, and thus experience heavier and non-uniform etching. As a result, the fin structures for FinFETs may have non-uniform fin height and fin pitch that affect device performance.

Accordingly, in some embodiments, the present disclosure provides a transistor, that can be planar, with a hybrid fin-dielectric (HFD) region including a fin structure disposed within a dielectric under a gate electrode. The HFD region increases the fin etching region associated with fin formation of FinFET or three-dimensional transistor devices thereby minimizing fin loading effects. For example, planar transistors in the MV or HV region can be formed with fins in a recessed region underneath the gate electrode and thereby increasing the fin etching area for FinFET formation. The fin structure may be formed as dummy fins and may be formed concurrently with the fin formation of FinFET or three-dimensional transistor devices from one or more of a substrate or a lightly doped region of the source region or drain region. In some embodiments, the HFD region can be formed from a combination of the fin structure and the dielectric, such as an oxide, which can be formed from a local oxidation of silicon (LOCOS) process, for example. Formation of the transistor with the HFD region is compatible with FinFET fabrication processes without extra processing steps and increases the fin etching area for formation of FinFET fins thus avoiding or reducing fin loading effects. Thus the HFD region of the transistor is suitable for fabrication of all-in-one chips with a mix of planar and three-dimensional devices with different operating voltages.

Figure 1B:
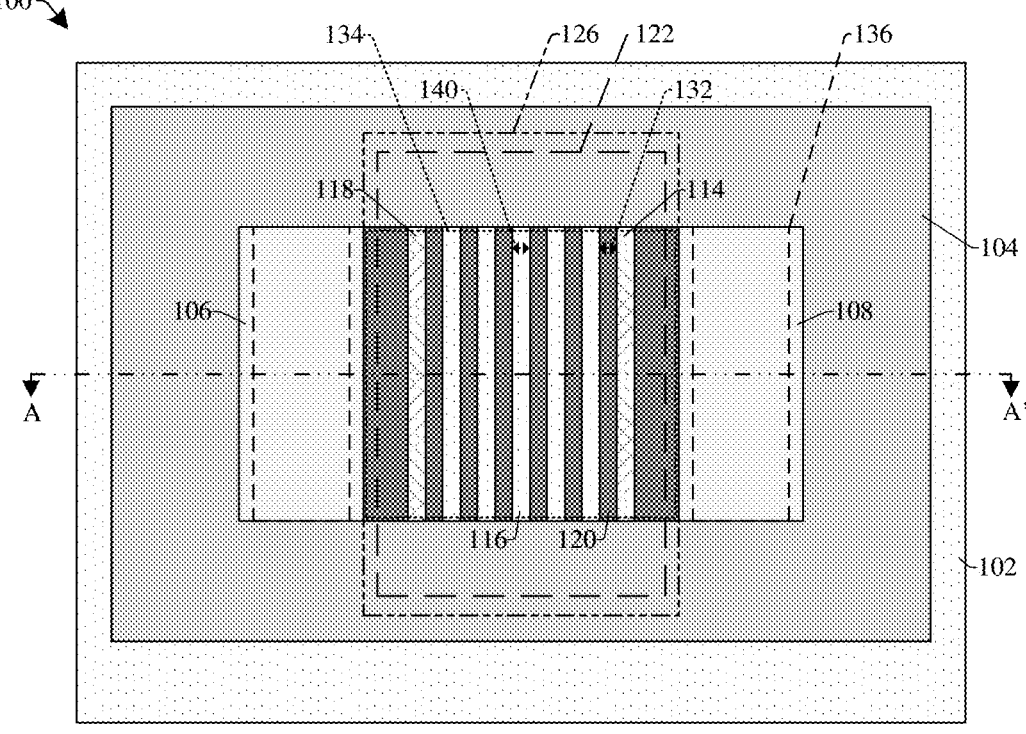
FIG. 1B illustrates a top view of some embodiments of the transistor of FIG. 1.

FIG. 1A illustrates a cross-sectional view of a transistor 100 in accordance with some embodiments, and FIG. 1B illustrates a top view of transistor 100 along line A-A' of FIG. 1. Notably, while the cross-sectional view of FIG. 1A depicts a dielectric layer 128 over the transistor 100, the dielectric layer 128 has been removed from FIG. 1B's top view for ease of viewing.

Referring now to FIGS. 1A and 1B concurrently, one can see the transistor 100 is disposed on a substrate 102 where the substrate 102 can be a semiconductor substrate. A HFD region 134 is included in the substrate 102 and may be laterally surrounded by a shallow trench isolation (STI) structure 104. In some cases, the substrate 102 comprises monocrystalline silicon and the STI structure 104 comprises an insulating material that extends into an upper surface of the substrate 102.

A source region 106 and a drain region 108 are separated from one another in a first direction along a line (e.g., corresponding to line A-A'). In the first direction, the source region 106 and the drain region 108 separate the HFD region 134 from the STI structure 104, and the source region 106 and the drain region 108 are laterally separated by the HFD region in the first direction. From a top view (e.g., FIG. 2), in a second direction perpendicular to the first direction, the STI structure 104 is disposed along the HFD region 134. The STI structure 104 extends along opposing sides of the HFD region 134 in the second direction. A lightly doped source (LDS) region 110 is disposed under the source region 106 and between the HFD region 134 and STI structure 104. A lightly doped drain (LDD) region 112 is disposed under the drain region 108 and between the HFD region 134 and STI structure 104. The LDS region 110 and LDD region 112 extend along a bottom surface of the HFD region 134 and neighboring of the LDD region 112 and LDS region 110 are separated by the substrate 102. As such, the HFD region 134 may be defined by source region 106, drain region 108, LDS region 110, and LDD region 112. In some cases, the LDS region 110 and the LDD region 112 are doped differently than the substrate 102. In some cases, the source region 106 and the drain region 108 comprise a semiconductor material with a first doping type and the substrate 102 comprises a semiconductor material with a second doping type different from the first doping type. In some cases, the LDS region 110 comprises a semiconductor material with the first doping type and with a doping concentration less than a doping concentration of the source region 106. In some cases, the LDD region 112 comprises a semiconductor material with the first doping type and with a doping concentration less than a doping concentration of the drain region 108.

In some embodiments, the HFD region 134 includes a plurality of fins of one direction, such as fins 114, 116, 118 separated by a dielectric 120. The fins 114, 116, 118 may be separated from one another by a fin offset 132. The fins 114, 116, 118 have a fin width 140. In some embodiments the fins 114, 116, 118 have the same fin width 140, while in alternative embodiments (not shown), the fins 114, 116, 118 can have differing fin widths. In some cases, the fins 114, 116, 118 can comprise a silicon material, and can be a doped material. For example, first fins 114 attached to an upper surface of the LDD region 112 can comprise at least a material or a doping of the LDD region 112. It is noted that first fins 114 can include one or more fins extending from the LDD region 112. Second fins 118 attached to an upper surface of the LDS region 110 can comprise at least a material or a doping of the LDS region 110. It is noted that second fins 118 can include one or more fins extending from the LDS region 110. Third fins 116 disposed between first fins 114 and second fins 118 can comprise a material of the substrate 102. As such, the third fins 116 separate the first fins 114 from the second fins 118. It is noted that third fins 116 can include one or more fins extending from the substrate 102. The dielectric 120 separate the fins 114, 116, 118 from the source region 106 and the drain region 108. Furthermore, the fins 114, 116, 118 extend to a top surface of the substrate 102 and the dielectric 120 extends over the fins 114, 116, 118, and the dielectric extends above the top surface of the substrate 102. Furthermore, the dielectric 120 can comprise curved outer sidewalls with a bottom portion of the curved outer sidewalls that are convex, and a top portion of the curved outer sidewalls that are concave.

In alternative embodiments (not pictured), fins 114, 116, 118 comprise the same material and doping. In some cases, the dielectric 120 can comprise an oxide material such as silicon dioxide and can be a field oxide. In the second direction, the fins 114, 116, 118 extend laterally and parallel to one another, and extend laterally and parallel to the source region 106 and the drain region 108. The fins 114, 116, 118 are separated from one another by the dielectric 120 in the first direction, and the fins 114, 116, 118 are further separated from the source region 106 and the drain region 108 by the dielectric 120 in the first direction. The fins may extend continuously between outer edges of the source region 106 and the drain region 108 in the second direction. Source and drain pads 138 are disposed above the source region 106 and the drain region 108, and further separate the HFD region 134 from the STI structure 104 in the first direction. The source and drain pads 138 extend from the source region 106 and the drain region 108 to a top surface of the HFD region 134.

In some embodiments, a dielectric layer 128 is disposed over the substrate 102 and a gate electrode 122 is disposed within the dielectric layer 128. The gate electrode 122 is disposed over the substrate 102 and overlies the HFD region 134. The source region 106 and the drain region 108 are disposed on opposite sides of the gate electrode 122. The dielectric 120 of the HFD region may extend past outer edges of the gate electrode in the first direction. A gate dielectric 124 disposed in the dielectric layer 128 separates the gate electrode 122 from the HFD region 134. The dielectric 120 of the HFD region 134 separates the dielectric layer 128 from the fins 114, 116, 118. The gate electrode may extend laterally in the first direction between nearest neighboring edges of the source region 106 and the drain region 108. The source region 106 and the drain region 108 may be vertically offset below the gate electrode 122. Furthermore, the HFD region 134 is vertically offset below a bottommost surface of the gate electrode 122. The gate electrode extends parallel to and past outer edges of the fins 114, 116, 118, in the second direction, and further extends over the STI structure. In some cases, the gate dielectric 124 can comprise a high-k dielectric material and the gate electrode can comprise a polysilicon or a metal. A sidewall spacer 126 which can, for example, comprise silicon nitride, laterally surrounds outer sidewalls of the gate electrode 122 and extends from the gate dielectric 124.

A gate electrode contact 130 and source/drain contacts 136 extend through the dielectric layer 128 and the gate electrode contact 130 electrically couples to the gate electrode 122 and the source/drain contacts 136 electrically couple to the source region 106 and the drain region 108 through source and drain pads 138.

In some embodiments, transistor 100 may be referred to as a hybrid fin gate transistor. In such a configuration, the source region 106 and the drain region 108 can have a first doping type (e.g., n-type), and the substrate 102 can have a second doping type (e.g., p-type) which is opposite the first doping type. A p-n junction can be formed between the source region 106, drain region 108, and the substrate 102. In some embodiments, the source region 106 is coupled to a source voltage terminal $V_S$, and the drain region 108 is coupled to a drain voltage terminal $V_D$, wherein control circuitry is configured to apply voltage(s) to the source and drain voltage terminals $V_S$, $V_D$ to turn the transistor 100 "ON" or "OFF." When transistor 100 is ON, a channel region 142 is formed between the source region 106 and the drain region 108 where the channel region 142 is disposed below the HFD region 134. The channel region 142 can extend through the LDS region 110, the substrate 102, and the LDD region 112. In some embodiments, the HFD region 134 does not conduct current, or conducts minimal current. As such, current flows further away from the gate electrode 122 relative to other transistor configurations absenting an additional dielectric region under the gate electrode 122 and the gate dielectric 124, and current leakage and noise are minimized. The dielectric 120 and fins 114, 116, 118, can be formed to realize optimal electric field formation within the HFD region 134 according to a design threshold voltage and transistor 100 operating characteristics. Specifically, the number of fins 114, 116, 118, fin offset 132, fin width 140, material composition of fins 114, 116, 118, and a width and a depth of the HFD region 134 can be selected to realize transistor 100 operating characteristics that minimize current leakage and noise.

Furthermore, formation of transistor 100 with the HFD region 134 is compatible with FinFET fabrication processes without additional processing steps, and thus transistor 100 can be formed in conjunction with a FinFET or other transistors with lower cost relative to other technologies. Additionally, the HFD region 134 increases the fin region for an all in one chip comprising MOSFET devices and FinFET devices thereby minimizing fin loading effects during fabrication. As such, the fins 114, 116, 118 of the HFD region 134 can be formed with compatible fin processes for other devices on all in one chips.

Figure 2A:
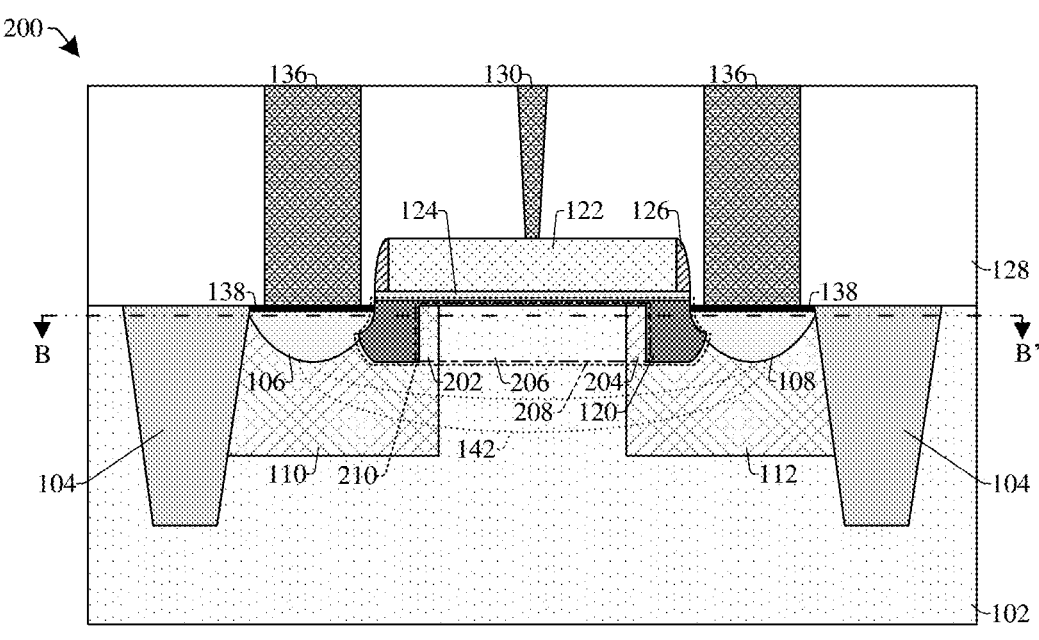
FIGS. 2A, 2B, and 2C illustrate some alternative embodiments of a transistor including a HFD region relative to FIGS. 1A and 1B.
Figure 2B:
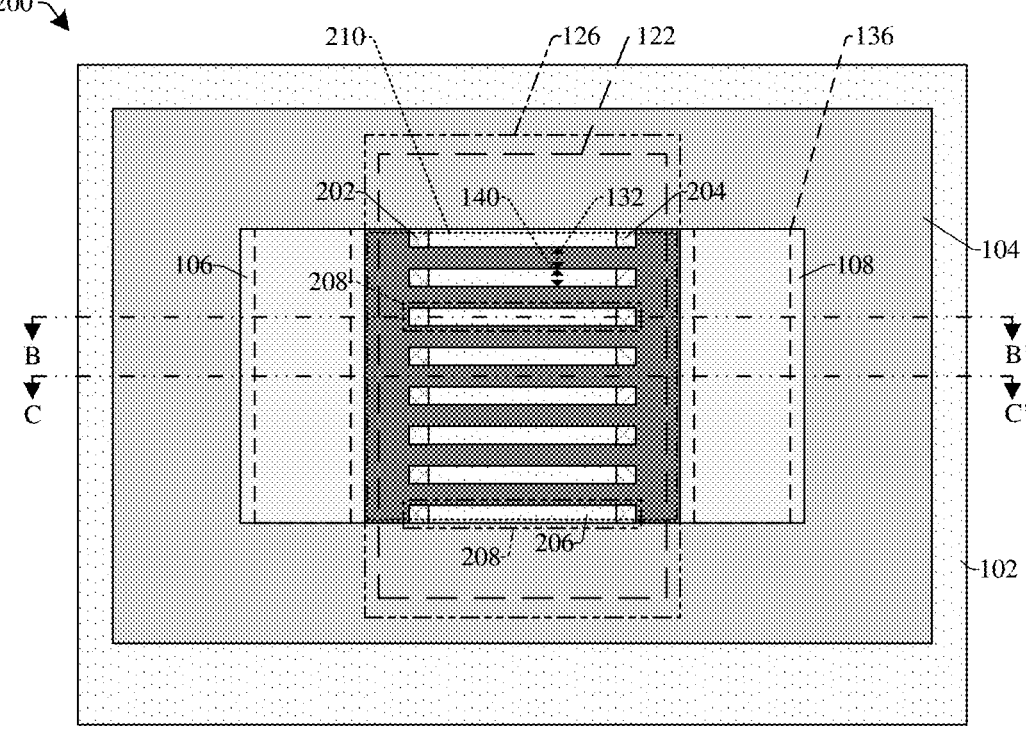
Figure 2C:
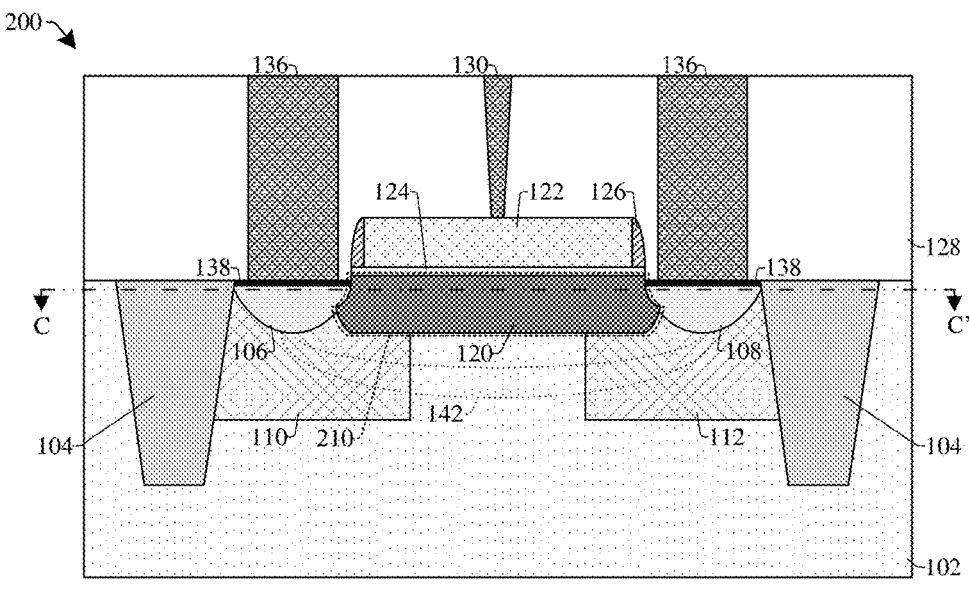

FIG. 2A illustrates a cross-sectional view of a transistor 200 in accordance with some alternative embodiments along a line B-B', FIG. 2B illustrates a top view of transistor 200, and FIG. 2C illustrates a cross-sectional view of transistor 200 along a line C-C'. Notably, while the cross-sectional views of FIGS. 2A and 2C depict a dielectric layer 128 over the transistor 200, the dielectric layer 128 has been removed from FIG. 2B's top view for ease of viewing.

FIGS. 2A, 2B, and 2C show alternative embodiments relative to FIGS. 1A and 1B with regards to the HFD region 134. The HFD region 134 of transistor 100 is configured with fins 114, 116, 118 with a longest lateral length perpendicular to the channel region 142. Transistor 200 illustrates an alternative embodiment where an alternative HFD region 210 of transistor 200 is configured with fins 208 with a longest lateral length parallel to the channel region 142.

Referring now to FIGS. 2A, 2B, and 2C concurrently, one can see that transistor 200 comprises the alternative HFD region 210 with fins 208 that continuously extend from the LDS region 110 to the LDD region 112. In a line defined by B-B' (e.g., FIGS. 2A and 2B), fins 208 have a first section 202 extending from the LDS region 110, a second section 204 extending from the LDD region 112, and a third section 206 extending from the substrate 102. As such, fins 208 comprise material from the LDS region 110, the LDD region 112, and the substrate 102. The dielectric 120 extends over the fins 208 and separate the fins 208 from one another, and from the source region 106, and the drain region 108. Furthermore, the dielectric 120 separates the fins 208 from the gate dielectric 124. In a line defined by C-C' (e.g., FIGS. 2B and 2C), the dielectric 120 extends continuously between the source region 106 and the drain region 108 where in the cross-sectional view of FIG. 2C there are no fins 208 between the channel region 142 and the gate electrode 122. As such, transistors 100 and 200 can be formed with fins from a HFD region where the fins extend parallel to the channel region 142 (e.g., transistor 200) or perpendicular to the channel region 142 (e.g., transistor 100).

Figure 3:
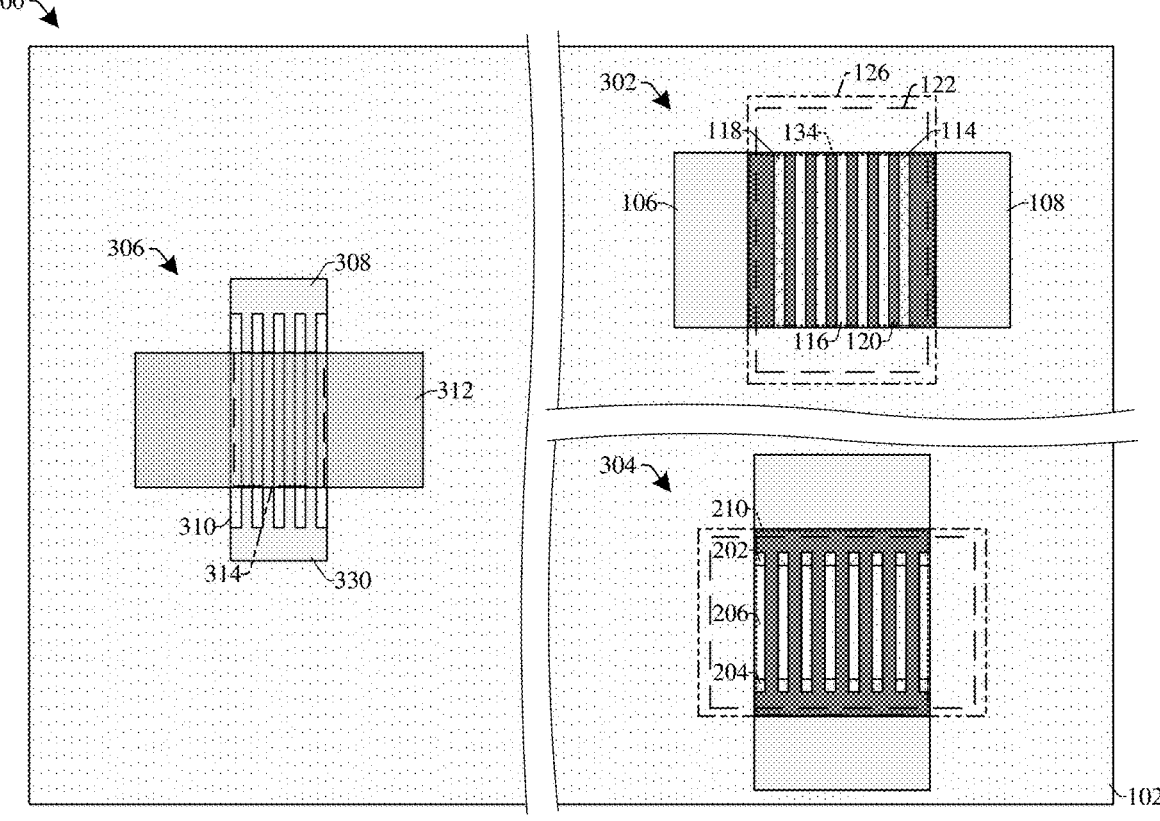
FIG. 3 illustrates a top view of an all in one chip with a low voltage, medium voltage, and high voltage region including a transistor with a HFD region.

FIG. 3 illustrates a top view of an all in one chip 300 with a low voltage (LV), medium voltage (MV), and high voltage (HV) region. The all in one chip 300 shows a first device 302, a second device 304, and a third device 306 that share substrate 102 of the all in one chip 300. In some embodiments, the first device 302 is a planar transistor (e.g., MOSFET) disposed within the MV region, the second device 304 is a planar transistor (e.g., MOSFET) disposed within the HV region, and the third device 306 is a three-dimensional transistor (e.g., FinFET) disposed within the LV region. In some embodiments, the LV region can include voltages from 0.7 volts (v) to 0.8 v, the MV region can include voltages from 0.8 v to 25 v, and the HV region can include voltages from 25 v to 28 v, for example. While the first, second, and third regions depict a single device (e.g., the first, second, and third device 302, 304, and 306 respectively), it is appreciated that FIG. 3 is an example and any number of devices may be within the first, second, and third regions.

The first device 302 can be the transistor 100 of FIGS. 1A and 1B. The second device 304 can be the transistor 200 of FIGS. 2A, 2B, and 2C with the alternative HFD region 210. It is noted that the first device 302 and the second device 304 are illustrated omitting some features, for example, the STI structure 104 of FIG. 2. It is appreciated that FIG. 3 is an example and the first and second region can include devices of either the first device 302 or the second device 304, or may include a combination of a plurality of devices including the first device 302 and the second device 304 in the first and second regions.

The third device 306 shows a top view of a FinFET including a FinFET gate 312, source/drain regions 330, 308, and fins 310 between the source/drain regions 330, 308. The FinFET gate 312 extends over a middle portion 314 of the fins 310 where the middle portion 314 is represented by a dashed line to illustrate the fins 310 under the Fin FET gate 312. The middle portion 314 may be surrounded by a gate dielectric and a gate electrode of the FinFET gate 312. The source/drain regions 330, 308 and fins 310 may extend above a bottom surface of the FinFET gate 312 (e.g., from a cross-sectional view, not shown). Formation of FinFET transistors are susceptible to fin loading effects, for example, when etching the fin structure. By expanding a fin etching area associated with forming the fins 310, fin loading effects are improved relative to a smaller fin etching area. As such, in some embodiments, one or more of the fins 114, 116, 118 of the HFD region 134 or the fins 208 of the alternative HFD region 210 can be formed in conjunction with the fins 310 of the third device 306. In some embodiments one or more of the fins 114, 116, 118 of the HFD region 134, the fins 208 of the alternative HFD region 210, and the fins 310 of the third device 306 extend parallel to one another, there by achieving a uniform fin etching process during fabrication and reducing fin loading. The etching area associated with formation of the fins 310 is increased to include other areas of all in one chip 300, and fin loading effects are minimized. As such, fins 114, 116, 118 of the HFD region 134, fins 208 of the alternative HFD region 210, and fins 310 can be formed from and over substrate 102.

Figure 4:
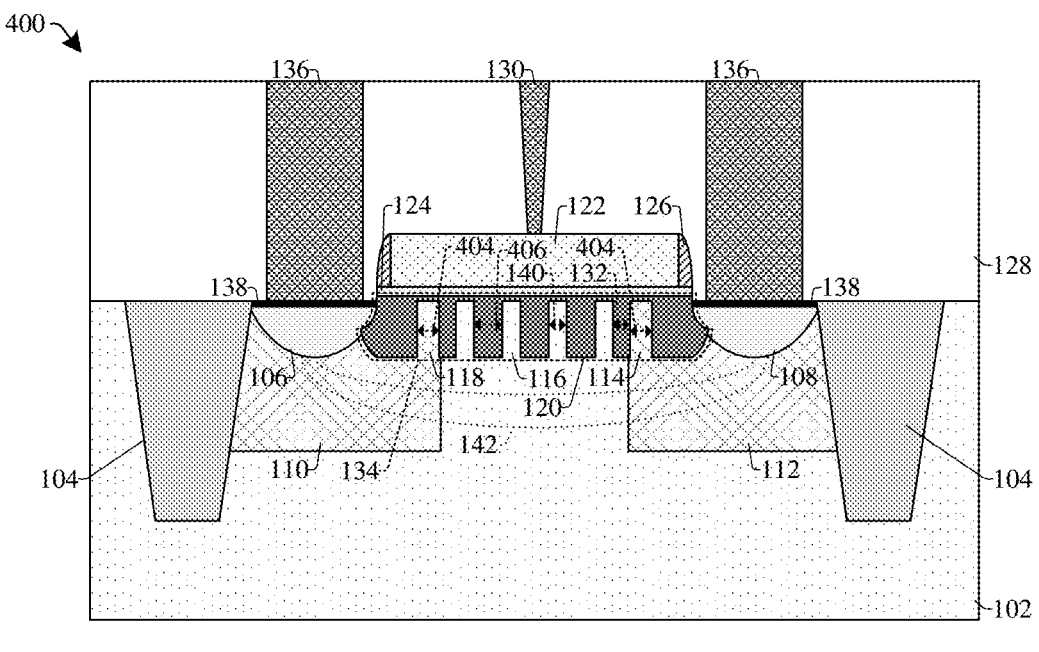
FIGS. 4 and 5 illustrate cross-sectional views of some alternative embodiments of a transistor relative to FIGS. 1A and 1B.

FIG. 4 illustrates a cross-sectional view of a transistor 400 with fins 114, 116, 118 of differing widths and spacing. FIG. 4 shows alternative features relative to FIG. 1A with regards to the fins 114, 116, 118.

Transistor 400 shows first fins 114 and second fins 118 with a wide fin width 404. The third fins 116 are separated from the first fins 114 and the second fins 118 by the fin offset 132, and the third fins 116 are separated from one another by a wide fin spacing 406. The wide fin width 404 is greater than the fin width 140 of the third fins and the wide fin spacing 406 is greater than the fin offset 132. As such, the HFD region 134 has differing fin widths and spacing. Referring generally, fins 114, 116, 118 can have differing widths and spacing based on a mask to form fins 114, 116, 118 to minimize fin loading among devices of an all in one chip and to realize compatibility with other processing steps for devices in the all in one chip. While FIG. 4 depicts fins 114, 116, 118 with a particular combination of spacing and widths, it is appreciated that a different combination of spacing and widths may be realized. Furthermore, it is appreciated that the fins of the alternative HFD region 210 of FIGS. 2A, 2B, and 2C can be formed with different widths and spacing analogous to transistor 400.

Figure 5:
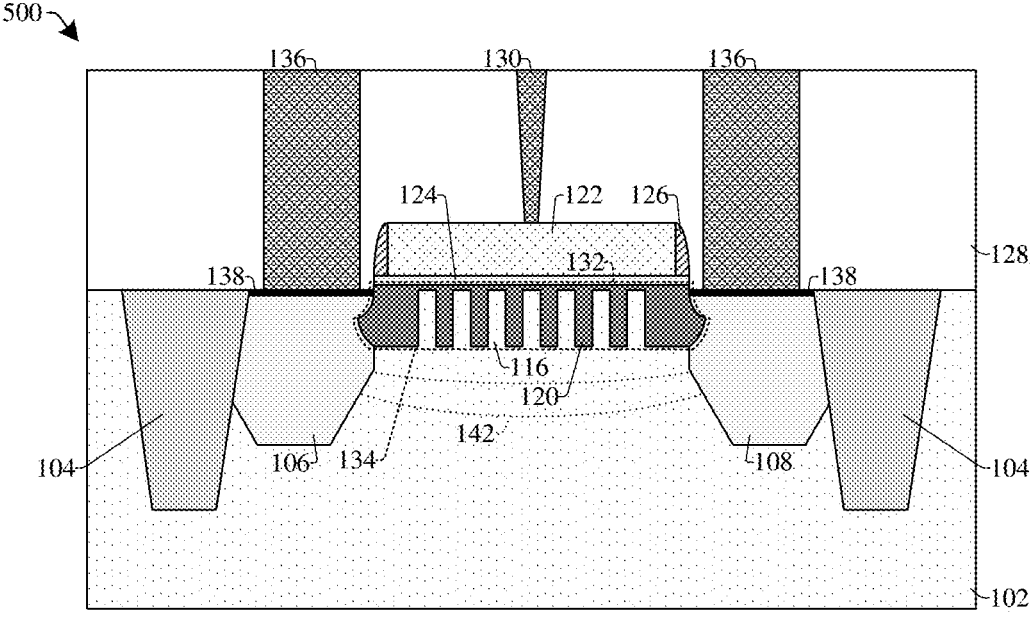

FIG. 5 illustrates a cross-sectional view of a transistor 500 with a source region 106 and a drain region 108 that extend past the HFD region 134. FIG. 5 shows alternative features relative to FIG. 1A with regards to the source region 106, the drain region 108, the LDD region 112, and the LDS region 110.

Transistor 500 shows a source region 106 and a drain region 108 that extend past a bottom surface of the HFD region 134. The source region 106, the drain region 108, and the source and drain pads 138 separate the HFD region 134 from the STI structure 104. In some cases, the source region 106 and the drain region 108 are formed from an epitaxial growth process and the source and drain pads 138 are formed from a silicide process. As such, formation of the source region 106, the drain region 108, and the source and drain pads 138 can reduce resistance in transistor 500 and reduce GIDL. Fins 116 of transistor 500 can have differing widths or spacing as described in accordance with transistor 400 of FIG. 4. Furthermore, fins 116 of transistor 500 can be the same material, such as the material of the substrate 102. It is appreciated that fins 116 of transistor 500 can alternatively extend according to the alternative HFD region 210 of FIGS. 2A, 2B, and 2C.

FIGS. 6-19 illustrate cross-sectional views of some embodiments of methods of forming a semiconductor device with a source region, a drain region, a gate electrode, and a HFD region under the gate electrode and between the source region and the drain region. Although the cross-sectional views 600-1900 shown in FIGS. 6-19 are described with reference to a method, it will be appreciated that the structures shown in FIGS. 6-19 are not limited to the method but rather may stand alone separate of the method. Furthermore, although FIGS. 6-19 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part. Also, alternative embodiments depicted in FIGS. 3-5 may be substituted for embodiments in FIGS. 6-19 although they may not be shown.

Figure 6:
FIGS. 6-19 illustrate cross-sectional views of some embodiments of methods of forming a semiconductor device with a source, a drain, a gate electrode, and a HFD region including fins and a dielectric.
Figure 6:
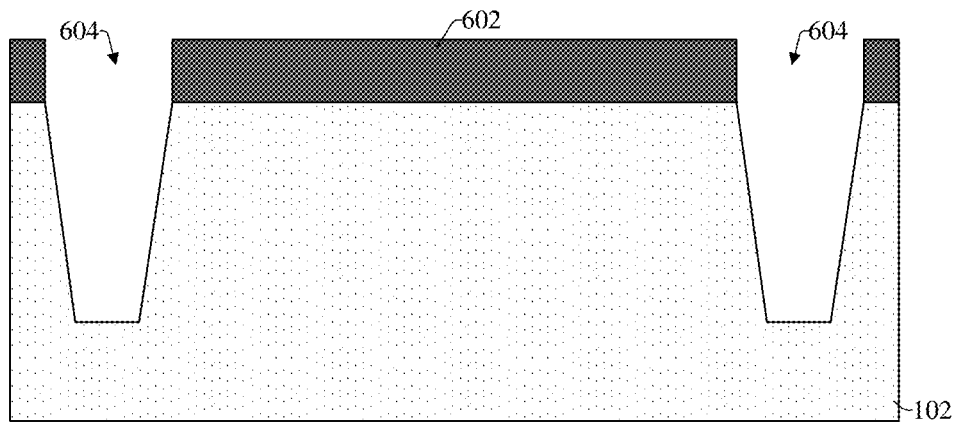

As shown in cross-sectional view 600 of FIG. 6, a first mask 602 is formed over a substrate 102. The substrate 102 may be or comprise, for example, silicon (Si), monocrystalline silicon, germanium (Ge), silicon-germanium (SiGe), gallium arsenide (GaAs), some other semiconductor material, or a combination thereof. The substrate 102 may also be a semiconductor on insulator substrate. The first mask 602 may be or comprise, for example, photoresist, silicon nitride, or some other suitable mask material.

Forming the first mask 602 includes a patterning process (not shown). The patterning process may, for example, comprise any of a photolithography process and an etching process. In some embodiments (not shown), a photoresist is formed over the first mask 602. The photoresist is patterned by an acceptable photolithography technique to develop an exposed photoresist. With the exposed photoresist in place, an etch is performed to transfer the pattern from the exposed photoresist to the underlying layers, for example, the first mask 602, to form opening 604 that extends through the first mask 602. The etching process may comprise a wet etching process, a dry etching process, or some other suitable etching process.

Subsequently, the substrate 102 is etched with first mask 602 on the substrate 102 to form a STI trench within an opening 604. Etching the substrate 102 can include a wet etching process, a dry etching process, or some other suitable etching process.

Figure 7:
Figure 7:
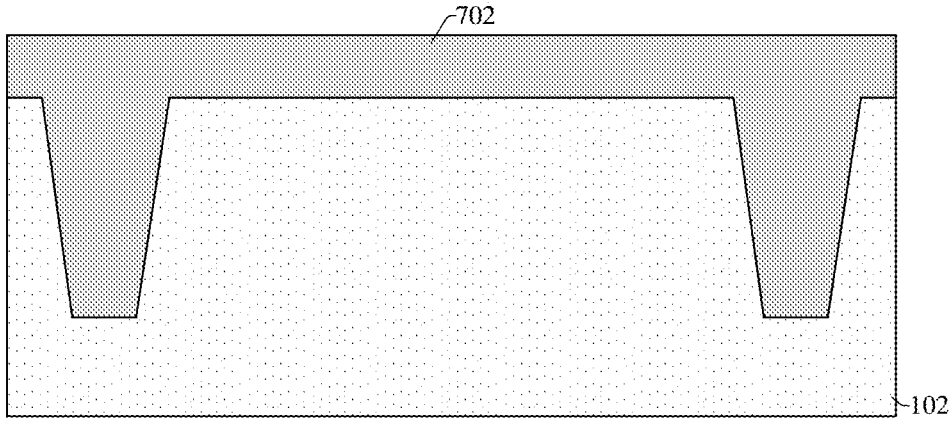

As shown in cross-sectional view 700 of FIG. 7, a dielectric layer 702 is formed within the STI trench. The first mask 602 of FIG. 6 is removed by a removal process. The removal process may, for example, be a chemical wash process, an etch process, a planarization process, an ashing process, or other suitable removal process. A dielectric layer 702 is formed in the STI trench of FIG. 6, covering the substrate 102. The dielectric layer 702 may, for example, be or comprise a dielectric material (e.g., silicon dioxide), a low-k dielectric, or the like. The dielectric layer 702, may, for example, be deposited by physical vapor deposition (PVD), chemical vapor deposition (CVD), or atomic layer deposition (ALD) process.

Figure 8:
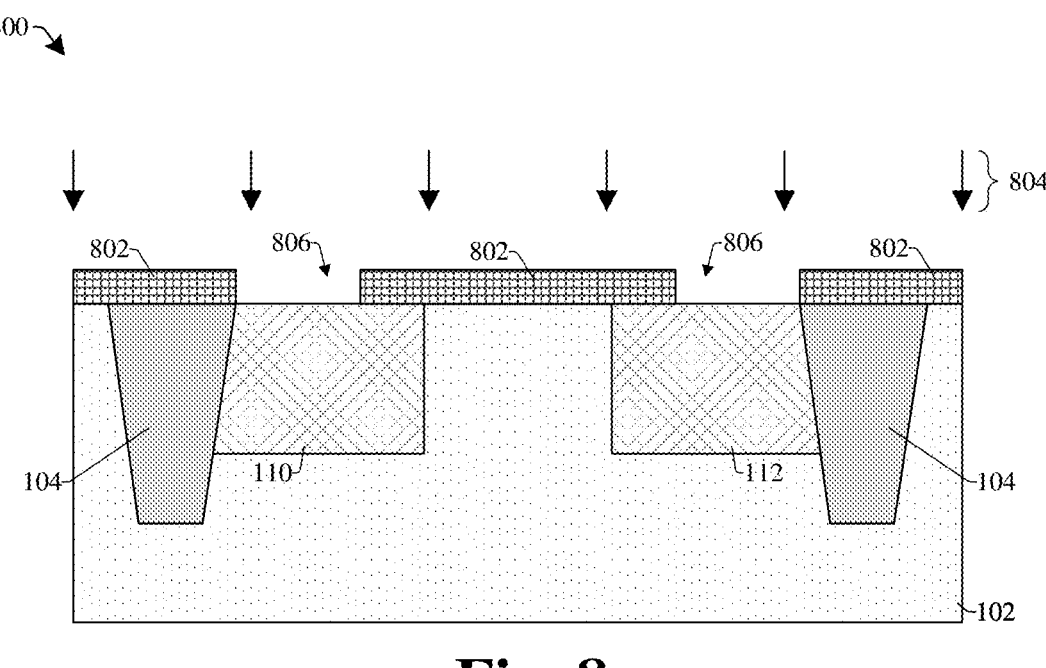

As shown in cross-sectional view 800 of FIG. 8, a STI structure 104 is formed from the dielectric layer 702 of FIG. 7, and a first photoresist 802 is formed over the substrate 102. The STI structure 104 is formed by removing the dielectric layer 702 of FIG. 7, from above the substrate 102 by an appropriate removal process such a chemical wash process, an etch process, a planarization process, an ashing process, or other suitable removal process. The STI structure 104 is formed extending from a top surface of the substrate 102 to a bottom surface of the STI trench of FIG. 6.

The first photoresist 802 is formed over the STI structure and the substrate 102. The first photoresist 802 is formed by a suitable deposition process and is patterned by an acceptable photolithography technique to form opening 806 over the substrate 102 and between inner neighboring sidewalls of the STI structure. The first photoresist 802 is exposed to a first doping process 804 to form a LDS region 110 and a LDD region 112 through opening 806. The LDS region 110 and LDD region 112 are formed laterally offset according to opening 806 and separated by substrate 102. The first doping process 804 can be an ion implantation process. In some embodiments, the opening 806 is narrower than a width of the LDS region 110 or the LDD region 112. In said embodiments, the first doping process 804 can include an angled ion implantation process to form a width of the LDS region 110 and the LDD region 112 that is greater than a width of opening 806. In other embodiments, the width of the opening 806 is substantially the same as the width of the LDS region 110 and the LDD region 112, and the first doping process 804 is a vertical ion implantation process.

The first doping process 804 comprises a first doping type. In some embodiments, the first doping type is different than a second doping type, where the substrate 102 is formed from the second doping type. In some embodiments, the first doping type is an n-type dopant and the second doping type is a p-type dopant. In other embodiments, the first doping type is a p-type dopant and the second doping type is an n-type dopant.

Figure 9:
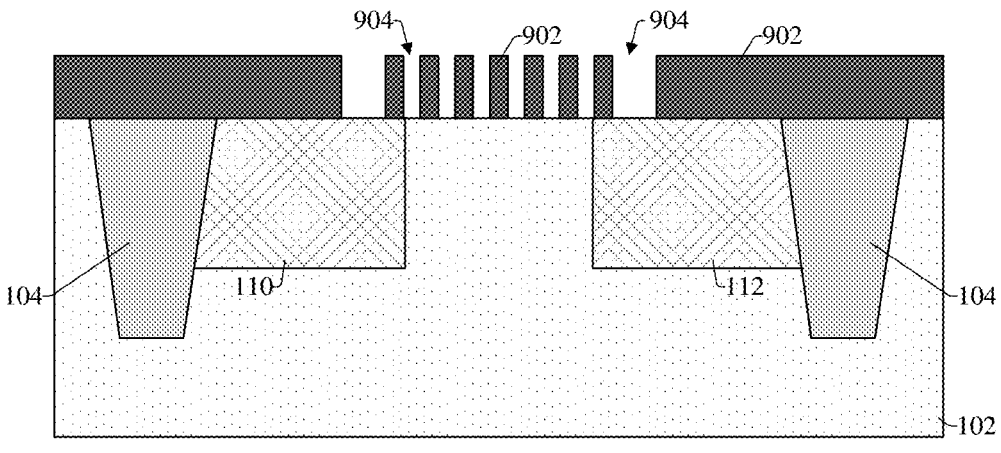

As shown in cross-sectional view 900 of FIG. 9, a second mask 902 is formed over the STI structure 104, substrate 102, LDS region 110, and LDD region 112. The second mask 902 may be or comprise, for example, photoresist, silicon nitride, or some other suitable mask material.

Forming the second mask 902 includes a patterning process (not shown). The patterning process may, for example, comprise any of a photolithography process and an etching process. In some embodiments (not shown), a photoresist is formed over the second mask 902. The photoresist is patterned by an acceptable photolithography technique to develop an exposed photoresist. With the exposed photoresist in place, an etch is performed to transfer the pattern from the exposed photoresist to the underlying layers, for example, the second mask 902, to form openings 904 that extend through the second mask 902. As such, the second mask 902 is formed with openings 904 aligned between the inner neighboring edges of the STI structure 104, and over the substrate 102, LDS region 110, and LDD region 112. The etching process may comprise a wet etching process, a dry etching process, or some other suitable etching process.

Figure 10:
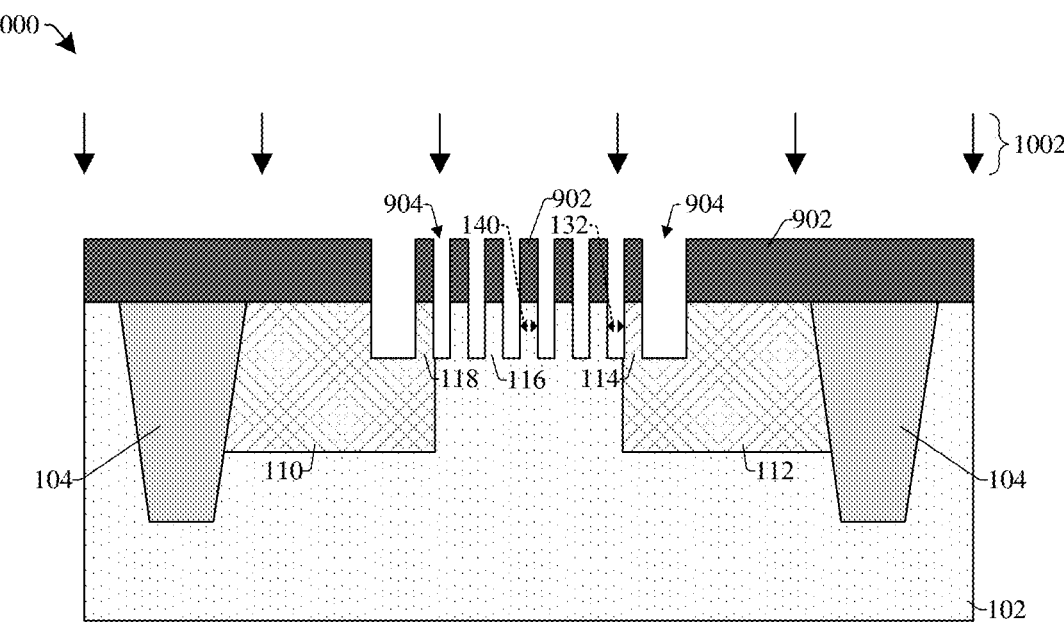

As shown in cross-sectional view 1000 of FIG. 10, the second mask 902 is exposed to an etchant 1002 to form fins 114, 116, 118. The etchant extends into a top surface of the substrate 102, LDS region 110, and LDD region 112 that are exposed through openings 904 of the second mask 902. As such, the etchant 1002 etches through openings 904 to form fins 114, 116, 118 including first fins 114 formed from the LDD region 112, second fins 118 formed from the LDS region 110, and third fins 116 formed from the substrate 102 between the first fins 114 and the second fins 118. It is appreciated that first fins 114, second fins 118, and third fins 116 can include a variable number of fins respectively. As such, the first fins 114 and the second fins 118 can comprise the same material as they are formed from the LDD region 112 and the LDS region 110 respectively, and the third fins 116 are comprised from the substrate 102 which is a different material relative to the LDD region 112 and the LDS region 110. In other embodiments, the fins 114, 116, 118 can comprise the same material, for example, as described in FIG. 5 (where fins 114, 116, 118 of FIG. 10 are analogous to fins 116 of FIG. 5). Furthermore, etchant 1002 forms fins 114, 116, 118 with a fin width 140 and separates fins 114, 116, 118 from one another by a fin offset 132. In some embodiments, fins 114, 116, 118 can be formed with differing widths and spacing as described in FIG. 4.

The fins 114, 116, 118 shown in FIG. 9 can be dummy fins formed for a planar device, as discussed above, the second mask 902 may be used to form fin structures across multiple devices regions of a wafer, including to form fin structures for a FinFET device (e.g. third device 306 in FIG. 3) as well as dummy fin structures in other regions for planar devices (e.g. first device 302 or second device 304 in FIG. 3). By introducing dummy fin patterns in regions with planar devices when patterning fin structures for FinFET devices, aperture ratios across multiple device regions of the second mask 902 are more uniform, and thus the loading effect for the fin etching can be improved, and more uniform fin height and fin pitch can be achieved.

Figure 11:
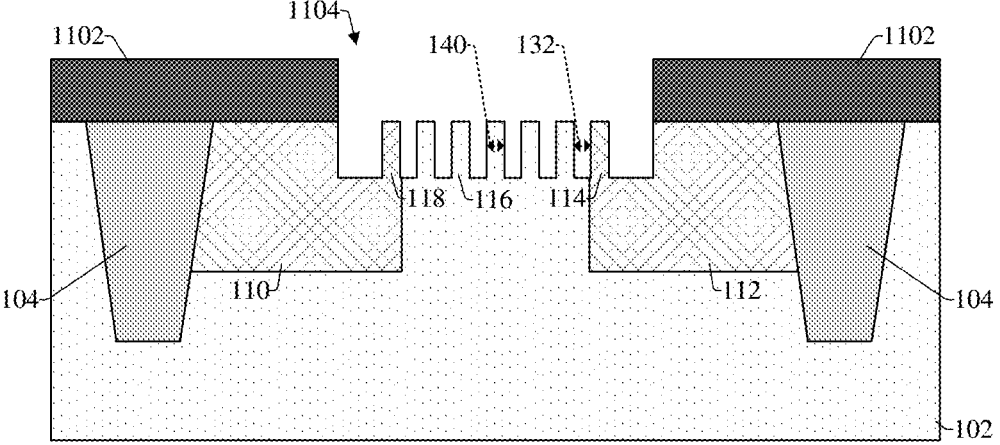

As shown in cross-sectional view 1100 of FIG. 11, the second mask 902 is removed and a third mask 1102 is formed. The second mask 902 of FIG. 10 is removed by an appropriate removal process. The third mask 1102 is formed with opening 1104 aligned over the fins 114, 116, 118. As such, fins 114, 116, 118 are exposed by opening 1104. The third mask 1102 may be or comprise, for example, silicon nitride, a silicon material, a nitride material, or other suitable mask material. The third mask 1102 is formed with an appropriate deposition process and patterned to form opening 1104 according to patterning processes described herein.

Figure 12:
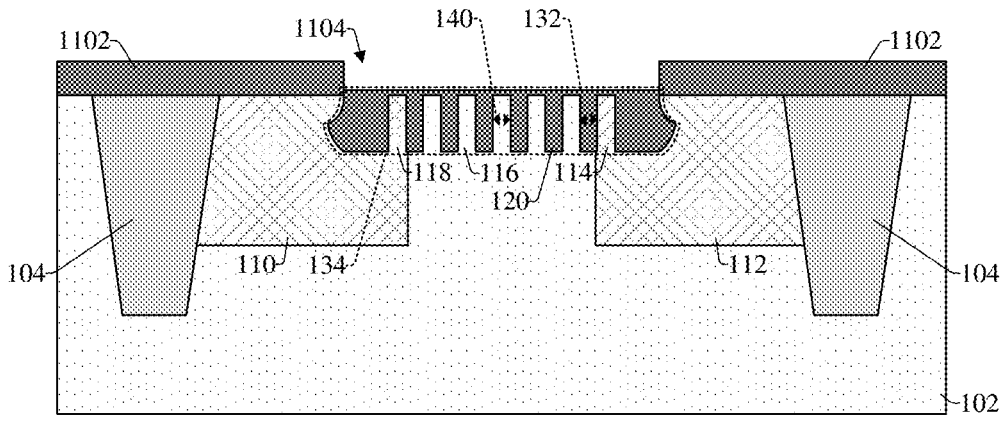

As shown in cross-sectional view 1200 of FIG. 12, a dielectric 120 is formed between the fins 114, 116, 118 forming a HFD region 134. The fins 114, 116, 118 exposed by the opening 1104 are subjected to a local oxidation of silicon (LOCOS) process. The third mask 1102 acts as a barrier material over the substrate 102, the LDS region 110, the LDD region 112, and the STI structure 104. The exposed fins 114, 116, 118, which comprise silicon, are subjected to thermal oxidation to grow dielectric 120 between the fins 114, 116, 118. The dielectric 120 is formed between the fins 114, 116, 118, and extends into the LDS region 110 and LDD region 112. As such, outer sidewalls of the dielectric 120 are formed with a top portion that are concave, and a bottom portion that is convex. Thus the dielectric 120 is formed with a lower half that is wider than an upper half. The dielectric 120 is further formed extending over fins 114, 116, 118. In some embodiments, the dielectric 120 is referred to as a field oxide (FOX). As such, in some embodiments, the dielectric 120 can be formed from an oxide material, silicon dioxide, a field oxide, or the like.

Figure 13:
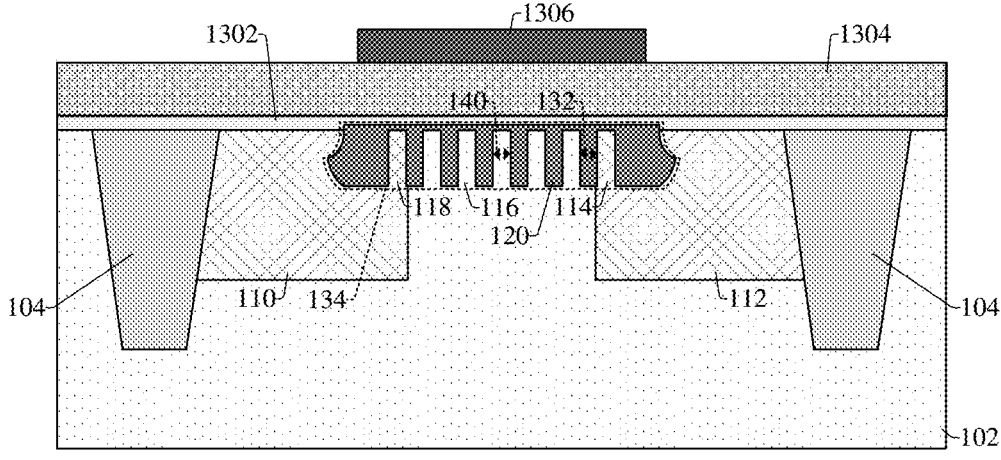

As shown in cross-sectional view 1300 of FIG. 13, a gate dielectric layer 1302 and a conductive layer 1304 are formed over the substrate 102, HFD region 134, LDS region 110, LDD region 112, and STI structure 104. The gate dielectric layer 1302 may, for example, be formed by thermal oxidation, CVD, PVD, sputtering, or the like. In some embodiments, the gate dielectric layer 1302 may, for example, comprise a high-k dielectric material. The conductive layer 1304 is formed over the gate dielectric layer 1302. The conductive layer 1304 may, for example, comprise an intermediate material (e.g., polysilicon), doped polysilicon, metal, or some other conductive material, and may, for example, be formed by CVD, PVD, sputtering, or the like. A fourth mask 1306 is formed over the conductive layer 1304 by forming a fourth masking layer or photoresist layer by an appropriate process (e.g., by a spin-on process) and selectively patterning the fourth masking layer e.g., by a photolithography process). The fourth masking layer is patterned to form the fourth mask 1306 aligned over the HFD region 134.

Figure 14:
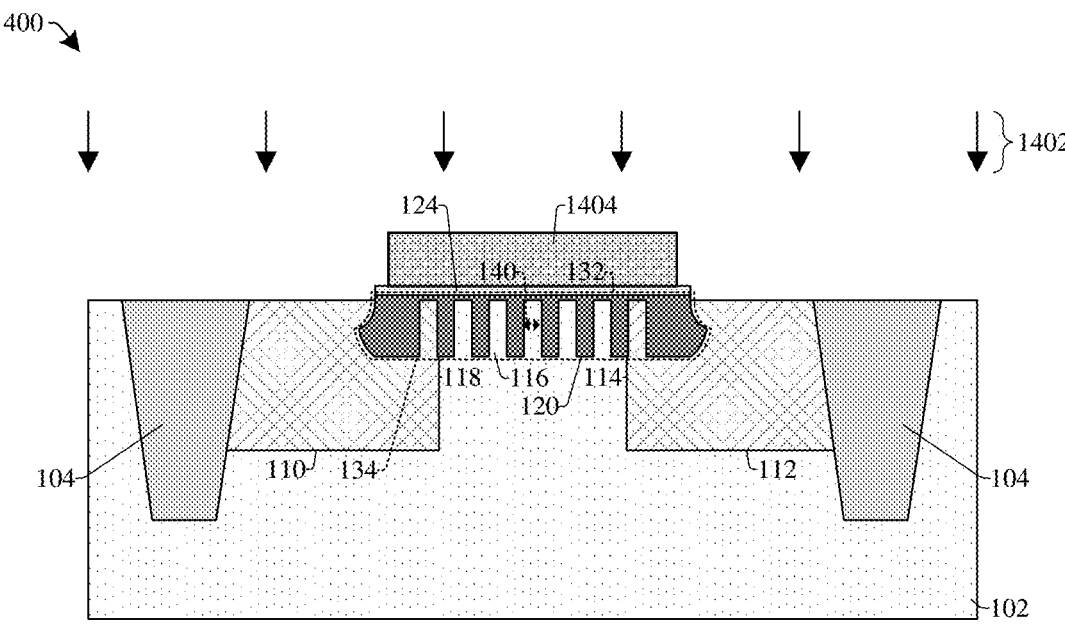

As shown in cross-sectional view 1400 of FIG. 14, a dummy gate 1404 and gate dielectric 124 are formed. With the fourth mask 1306 of FIG. 13 in place, the conductive layer 1304 and the gate dielectric layer 1302 are exposed to an etchant 1402 (e.g., dry etch or wet etch) to form the dummy gate 1404 and gate dielectric 124 respectively. The gate dielectric 124 is formed above the HFD region 134 and extends past the fins 114, 116, 118 and to outer edges of the dielectric 120 at a top surface of the dielectric 120 where a lower surface of the dielectric 120 extends past outer edges of the gate dielectric 124. The dummy gate 1404 is formed overlying the fins 114, 116, 118 and the dielectric 120 where the dielectric 120 extends past outer edges of the dummy gate 1404. The dummy gate 1404 may undergo a subsequent process, for example, a replacement poly-gate (RPG) high-k metal gate (HKMG) process in a later fabrication step. The fourth mask 1306 of FIG. 13 is subsequently removed by an appropriate removal process.

Figure 15:
Figure 15:
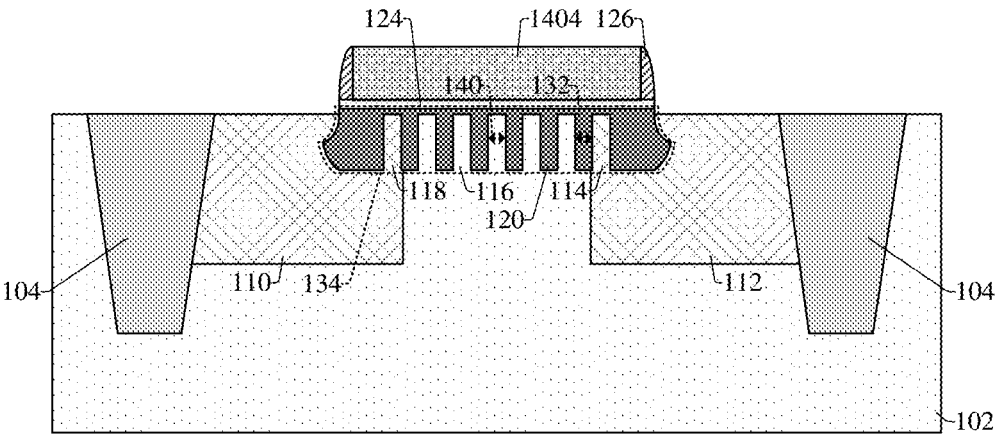

As shown in cross-sectional view 1500 of FIG. 15, a sidewall spacer 126 is formed on sidewalls of the dummy gate 1404 extending from the gate dielectric 124 to a top surface of the dummy gate 1404. In some embodiments, a mask is formed over the substrate 102, LDS region 110, LDD region 112, and STI structure 104 to prevent formation of the sidewall spacer 126 over said structures by a deposition process. The sidewall spacer 126 may, for example, be silicon nitride, silicon dioxide, some other dielectric, or a combination of the foregoing. In some embodiments, a process for forming the sidewall spacer 126 comprises depositing or growing a spacer layer covering and conformally lining the semiconductor structure of FIG. 14. The spacer layer may, for example, be deposited or grown by CVD, PVD, sputtering, or some other deposition or growth process. Further, in some embodiments, the process comprises performing an etch back into the spacer layer to remove horizontal segments of the spacer layer without removing vertical segments of the spacer layer.

Figure 16:
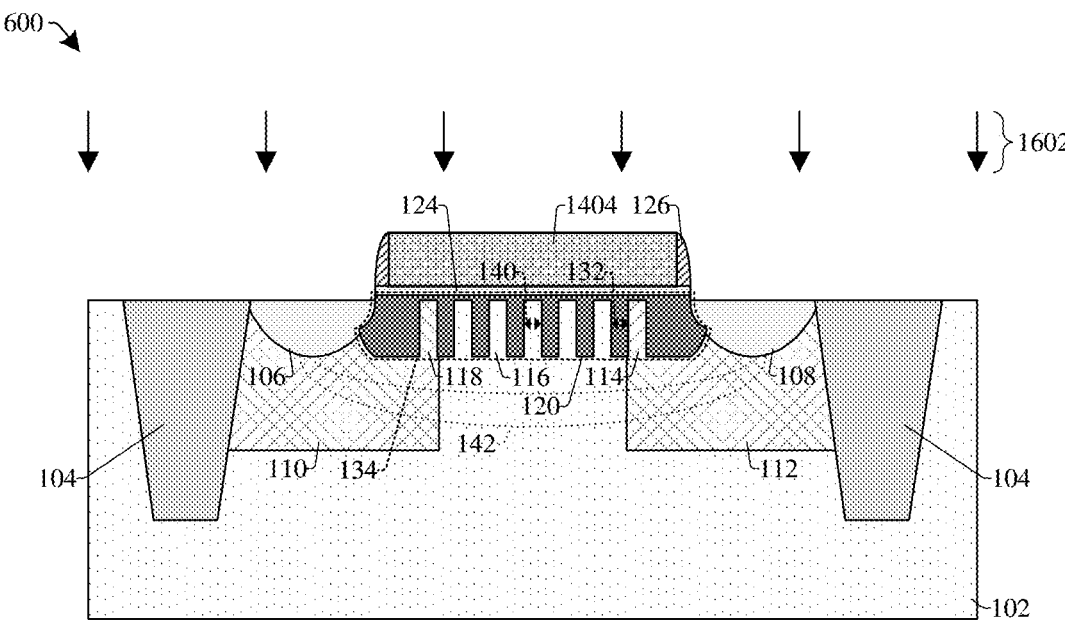

As shown in cross-sectional view 1600 of FIG. 16, a source region 106 and a drain region 108 are formed under the dummy gate 1404 and the gate dielectric. The source region 106 is formed within the LDS region 110 between the STI structure 104 and the HFD region 134 below the dummy gate 1404 according to a second doping process 1602. The drain region 108 is formed within the LDD region 112 between the STI structure 104 and the HFD region 134 below the dummy gate 1404 according to the second doping process 1602. In some embodiments, a patterned mask is formed over the structure of cross-sectional view 1600 with openings over the LDS region 110 and the LDD region 112 before performing the second doping process 1602. The source region 106 and the drain region 108 can be formed with the first doping type according to the second doping process 1602. In some embodiments, the source region 106 comprises the same doping type as the LDS region 110 and the drain region 108 comprises the same doping type as the LDD region 112. In some embodiments, the source region 106 and the drain region 108 are doped with a higher concentration of dopants from the second doping process 1602 than the LDS region 110 and the LDD region 112 according to the first doping process 804 of FIG. 8.

In alternative embodiments, the source region 106 and the drain region 108 are formed by an epitaxial growth process (not pictured). For example, corresponding to transistor 500 of FIG. 5, rather than forming the LDS region 110 and the LDD region 112 in accordance with FIG. 8, and rather than forming the source region 106 and the drain region 108 according to the second doping process 1602 of FIG. 16, the source region 106 and the drain region 108 can be formed according to an epitaxial growth process. As such, the substrate 102 exposed between the STI structure 104 and the HFD region 134 is etched and the source region 106 and the drain region 108 are formed by epitaxial growth. As such, the epitaxial growth process can include forming the source region 106 and the drain region 108 with a doped silicon material according to the first doping type. By forming the source region 106 and the drain region 108 by epitaxial growth, resistance and current leakage of a transistor comprising the source region 106 and the drain region 108 is reduced.

Figure 17:
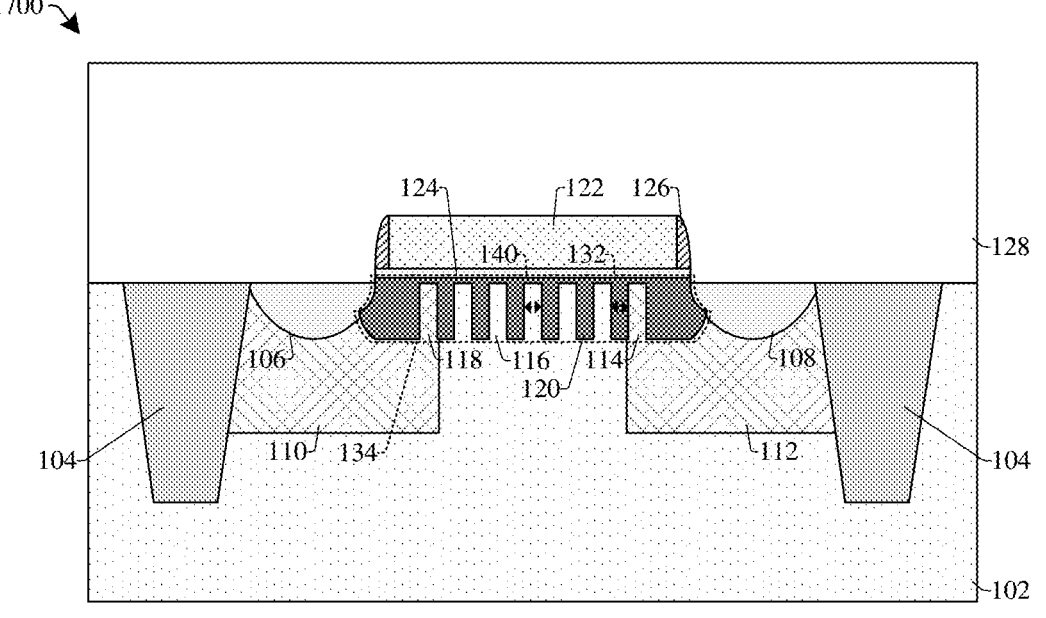

As shown in cross-sectional view 1700 of FIG. 17, the dummy gate 1404 of FIG. 16 is replaced with a gate electrode 122 and a dielectric layer 128 is formed over the substrate 102. The dielectric layer 128 is formed over the substrate 102, the STI structure 104, the LDS region 110, the LDD region 112, the sidewall spacer 126, and the dummy gate 1404 of FIG. 16. The dielectric layer 128 may comprise one or more layers of, for example, a low-k dielectric (e.g., a dielectric material with a dielectric constant less than about 3.9), an oxide (e.g., $SiO_2$), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like. The dielectric layer 128 may, for example, be formed by CVD, PVD, sputtering, or another deposition or growth process, or a combination thereof.

A RPG HKMG process is performed on the dummy gate 1404 of FIG. 16 where the dummy gate 1404 of FIG. 16 is replaced with a gate material (e.g., polysilicon or a metal, such as aluminum (Al), copper (Cu), titanium (Ti), tantalum (Ta), tungsten (W), molybdenum (Mo), cobalt (Co), or the like). The RPG HKMG process can include one or more planarization processes, etching processes according to patterned masks or photoresists, and deposition process with the gate material to form the gate electrode 122. For example, in some embodiments, a removal or planarization process is performed on the dielectric layer 128 to expose a top surface of the dummy gate 1404. A removal process is performed on the dummy gate 1404, forming an opening and exposing inner sidewalls of the sidewall spacer 126 and a top surface of the gate dielectric 124. A deposition process is performed in the opening with the gate material, the gate material fills the opening and can extend along a top surface of the dielectric layer 128 thus forming a gate material layer. A removal or planarization process is performed on the gate material layer to form the gate electrode 122 extending from the top surface of the gate dielectric 124 to a top surface of the sidewall spacer. Subsequently, additional layers of the dielectric layer 128 can be formed to extend the dielectric layer 128 above the gate electrode 122. The RPG HKMG process can provide a uniform height for the gate and underlying features. Furthermore, the RPG HKMG process can provide a length of the gate electrode 122 precisely controlled, and can prevent metal migration thereby improving device performance.

Figures 18, 19:
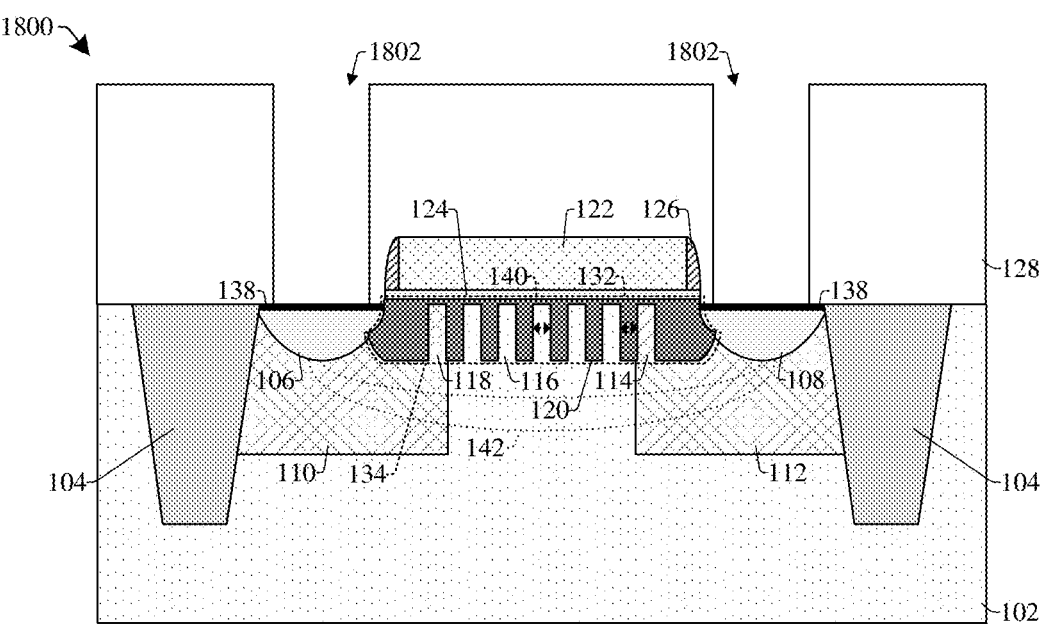

As shown in cross-sectional view 1800 of FIG. 18, source and drain pads 138 are formed within the source region 106 and the drain region 108. A removal process is performed on the dielectric layer 128 to form openings 1802 aligned over the source region 106 and the drain region 108. The removal process can be an etching process (e.g., dry etch or wet etch), performed on the dielectric layer 128 according to a patterned mask (not shown). Openings 1802 are formed extending through the dielectric layer 128 exposing a top surface of the source region 106 and the drain region 108. A salicidation process is performed on the top surface of the source region 106 and the drain region 108 through openings 1802. In some embodiments, the salicidation process to form the source and drain pads 138 can include depositing a metal over the source region 106 and the drain region 108, heating the semiconductor device of FIG. 18 to integrate the metal into the exposed surfaces of the source region 106 and the drain region, and removing excess metal. Formation of the source and drain pads 138 within the source region 106 and the drain region 108 can reduce GIDL and lower resistance of the transistor comprising the gate electrode 122, the source region 106, and the drain region 108. The source and drain pads 138 increase electrical conductivity between the source region 106 and the drain region that couple to contacts (e.g., source/drain contacts 136 of FIG. 19).

As shown in cross-sectional view 1900 of FIG. 19, source/drain contacts 136 are formed over the source region 106 and the drain region 108, and a gate electrode contact 130 is formed over the gate electrode 122. Source/drain contacts 136 are formed within openings 1802 of FIG. 18 and couple to the source region 106, and the drain region 108. The gate electrode contact 130 is formed extending through the dielectric layer 128. The gate electrode contact 130 is formed in the dielectric layer 128 by patterning the dielectric layer 128 and depositing a metal through the patterned dielectric layer 128 to form the gate electrode contact 130. The gate electrode contact 130 and the source/drain contacts 136 may, for example, be or comprise W, Cu, Al, or the like. The features of FIG. 19 form the transistor that when turned ON form a channel region 142 between the source region 106 and the drain region 108 where the channel region 142 is formed below the HFD region 134. The channel region 142 can extend through the LDS region 110, the substrate 102, and the LDD region 112.

FIG. 20 illustrates a flow diagram of some embodiments 2000 of the method of FIGS. 6-19. While FIG. 20 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or describe herein. In addition, not all illustrated acts may be required to implement one or more aspects or embodiments of the description herein. Further, one or more of the acts depicted herein may be carried out in one or more separate acts and/or phases and/or steps.

At 2002, a STI structure is formed within a substrate. The STI structure can be formed according to an etching process, a deposition process, and a removal or planarization process. FIGS. 6-8 illustrate cross-sectional views 600-800 of some embodiments corresponding to act 2002.

At 2004, a photoresist is formed and patterned over the substrate with openings and a doping process is performed through the openings of the photoresist to form a LDS region and a LDD region between sidewalls of the STI structure within the substrate. FIG. 8 illustrates cross-sectional view 800 of some embodiments corresponding to act 2004

At 2006, a mask is formed over the substrate and patterned forming openings over a top surface of the substrate between the LDS region and the LDD region, and forming openings over a top surface of the LDS region and the LDD region. FIG. 9 illustrates cross-sectional view 900 of some embodiments corresponding to act 2006.

At 2008, the substrate is etched through the mask of act 2004, to form fins from the substrate between nearest neighboring inner sidewalls of the STI structure. The etch further forms fins from the LDS region and the LDD region. In some aspects, the fins include first fins formed form the LDS region, second fins formed from the LDD region, and third fins formed from the substrate. The mask of act 2004 is subsequently removed. FIGS. 10-11 illustrate cross-sectional views 1000-1100 of some embodiments corresponding to act 2008.

At 2010, a mask is formed over the substrate and patterned to form an opening through the mask over the fins. A dielectric is formed between the fins and the mask of act 2010 is removed. The fins and dielectric form a HFD region. FIGS. 11-12 illustrate cross-sectional views 1100-1200 of some embodiments corresponding to act 2010.

At 2012, a gate dielectric and a dummy gate are formed over the HFD region. The gate dielectric is formed from a gate dielectric layer disposed over the substrate, and the dummy gate is formed from a conductive layer formed over the gate dielectric layer. FIGS. 13-14 illustrate cross-sectional views 1300-1400 of some embodiments corresponding to act 2012.

At 2014, a sidewall spacer is formed along outer sidewalls of the dummy gate, extending to a top surface of the gate dielectric. FIG. 15 illustrates cross-sectional view 1500 of some embodiments corresponding to act 2014.

At 2016, a source region and a drain region are formed between the HFD region and the STI structure according to a doping process where the source region and the drain region are respectively formed within the LDS region and the LDD region. FIG. 16 illustrates cross-sectional view 1600 of some embodiments corresponding to act 2016.

At 2018, the dummy gate is replaced with a gate electrode and a dielectric layer is formed over the substrate. In some embodiments, the dummy gate may be replaced with a gate electrode by a RPG HKMG process. FIG. 17 illustrates cross-sectional view 1700 of some embodiments corresponding to act 2018.

At 2020, a source and drain pads are formed in the LDS region and the LDD region. The dielectric is etched to form openings exposing a top surface of the LDS region and the LDD region. The exposed top surface of the LDS region and the LDD region undergoes a salicidation process to form the source and drain pads. FIG. 18 illustrates cross-sectional view 1800 of some embodiments corresponding to act 2020.

At 2022, source/drain contacts and a gate electrode contact are formed through the dielectric and couple to the source region, the drain region, and the gate electrode. FIG. 19 illustrates cross-sectional view 1900 of some embodiments corresponding to act 2022.

Accordingly, in some embodiments, the present disclosure relates to a method of forming a structure having a source region, a drain region, a gate electrode, and a HFD region comprised of a plurality of fins and dielectric that separates the plurality of fins from the gate electrode, source region, and drain region.

In various embodiments, the present application provides a transistor including a substrate, a source region, and a drain region where the source region and the drain region are laterally separated by a hybrid fin-dielectric (HFD) region. A gate electrode is disposed above the HFD region and the HFD region includes a plurality of fins covered by a dielectric and separated from the source region and the drain region by the dielectric.

In various embodiments, the present application provides a semiconductor device including a gate electrode disposed over a substrate. A source region and a drain region are disposed on opposite sides of the gate electrode, and a shallow trench isolation (STI) structure is disposed within the substrate surrounding the source region and the drain region. A hybrid fin-dielectric (HFD) region is disposed in the substrate underneath the gate electrode. The HFD region includes fins separated and isolated from the source region and the drain region by a dielectric. The source region and the drain region separate the HFD region from the STI structure in a first direction, and the STI structure extends along opposing sides of the HFD region in a second direction perpendicular to the first direction.

In various embodiments, the present application provides a method of forming a semiconductor structure including forming a shallow trench isolation (STI) structure within a substrate. A first mask is formed over the substrate where the first mask is formed with openings that extend through the first mask. The substrate is removed through the openings of the first mask to form fins from the substrate between nearest neighboring sidewalls of the STI structure, and the first mask is removed. A second mask is formed over the substrate with an opening aligned over the fins. A dielectric is formed between the fins and the second mask is removed where the fins and the dielectric form a hybrid fin-dielectric (HFD) region. A source region and a drain region are formed between the HFD region and the STI structure. The source and drain regions are spaced apart from the fins by the dielectric, and a gate electrode is formed over the HFD region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor comprising:
   a substrate;
   a source region and a drain region laterally separated by a hybrid fin-dielectric (HFD) region; and
   a gate electrode disposed above the HFD region, wherein the HFD region comprises a plurality of fins covered by a dielectric and separated from the source region and the drain region by the dielectric, wherein the plurality of fins comprise first fins, second fins, and third fins, wherein the first and second fins comprise a different material relative to the third fins.

2. The transistor of claim 1, wherein a top surface of the HFD region is vertically offset below a bottom surface of the gate electrode.

3. The transistor of claim 2, wherein a gate dielectric is disposed between the HFD region and the gate electrode.

4. The transistor of claim 3, wherein the dielectric extends over the plurality of fins, and the dielectric separates the plurality of fins from the gate dielectric.

5. The transistor of claim 1, further comprising a lightly doped source (LDS) region disposed under the source region and a lightly doped drain (LDD) region disposed under the drain region.

6. The transistor of claim 5, wherein the HFD region and the substrate separate the LDS region from the LDD region.

7. The transistor of claim 5, wherein the LDS region and LDD region extend along a bottom surface of the HFD region.

8. The transistor of claim 7, wherein a channel region extends through the LDS region, the substrate directly below the HFD region, and through the LDD region.

9. The transistor of claim 5, wherein the LDS region and LDD region are doped differently from the substrate, and wherein the first fins extend from the LDD region, the second fins extend from the LDS region, and the third fins extending from the substrate.

10. The transistor of claim 9, wherein the first fins comprise a material of the LDD region, the second fins comprise a material of the LDS region, and the third fins comprise a material of the substrate.

11. A semiconductor device comprising:
   a gate electrode disposed over a substrate;
   a source region and a drain region disposed on opposite sides of the gate electrode, and a shallow trench isolation (STI) structure disposed within the substrate surrounding the source region and the drain region; and
   a hybrid fin-dielectric (HFD) region disposed in the substrate underneath the gate electrode, wherein the HFD region comprises fins separated and isolated from the source region and the drain region by a dielectric; and
   wherein the source region and the drain region separate the HFD region from the STI structure in a first direction, and wherein the STI structure extends along opposing sides of the HFD region contacting opposing ends of each of the fins in a second direction perpendicular to the first direction.

12. The semiconductor device of claim 11, wherein the dielectric of the HFD region extends past outer edges of the gate electrode in the first direction.

13. The semiconductor device of claim 11, wherein the HFD region extends past outer edges of the gate electrode in the first direction.

14. The semiconductor device of claim 11, wherein the HFD region is vertically separated below a bottommost surface of the gate electrode, and a first device comprises the HFD region, gate electrode, source region, and drain region; and
   the first device is laterally offset from a second device comprising a fin between a source and drain region of the second device, wherein the fin extends above the substrate and above a bottom surface of a gate electrode of the second device.

15. The semiconductor device of claim 11, wherein the fins extend continuously between inner neighboring edges of the source region to the drain region in the first direction, and the fins are separated from one another by the dielectric in the second direction.

16. The semiconductor device of claim 15, wherein the fins are separated from one another by the dielectric in the first direction, and the fins are further separated from the source region and the drain region by the dielectric in the first direction; and
   the fins extend continuously between outer edges of the source region and drain region in the second direction.

17. The semiconductor device of claim 11, wherein the fins comprise first fins and second fins, and a fin width of one of the first fins is different from a fin width of one of the second fins.

18. The semiconductor device of claim 11, wherein the gate electrode extends parallel to and past outer edges of the fins in the second direction, and further extends over the STI structure.

19. A method of forming a semiconductor structure, comprising:
   forming a shallow trench isolation (STI) structure within a substrate;
   forming a first mask over the substrate where the first mask is formed with openings that extend through the first mask;

removing the substrate through the openings of the first mask to form fins from the substrate between nearest neighboring sidewalls of the STI structure, and removing the first mask;

forming a second mask over the substrate with an opening aligned over the fins;

forming a dielectric between the fins, and removing the second mask wherein the fins and the dielectric form a hybrid fin-dielectric (HFD) region;

forming a source region and drain region between the HFD region and the STI structure, wherein the source and drain regions are spaced apart from the fins by the dielectric; and forming a gate electrode over the HFD region.

20. The method of claim 19, further comprising:

forming a photoresist over the substrate, wherein the photoresist is patterned;

implanting a first doping type into the substrate between neighboring edges of the STI structure to form a lightly doped source (LDS) region and a lightly doped drain (LDD) region; and forming the first mask over the substrate and the LDS region and the LDD region.

* * * * *